(12) United States Patent
Tseng et al.

(10) Patent No.: US 10,074,680 B2
(45) Date of Patent: Sep. 11, 2018

(54) IMAGE SENSOR WITH LOW STEP HEIGHT BETWEEN BACK-SIDE METAL AND PIXEL ARRAY

(71) Applicant: Taiwan Semiconductor Manufacturing Company, Ltd., Hsin-Chu (TW)

(72) Inventors: Chien-Hsien Tseng, Hsin-Chu, TX (US); Nai-Wen Cheng, Tainan (TW); Shou-Gwo Wuu, Hsin-Chu (TW); Ming-Tsong Wang, Taipei (TW); Tung-Ting Wu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/061,799

(22) Filed: Mar. 4, 2016

(65) Prior Publication Data

US 2016/0190190 A1  Jun. 30, 2016

Related U.S. Application Data

(62) Division of application No. 13/650,339, filed on Oct. 12, 2012, now Pat. No. 9,299,740.

(Continued)

(51) Int. Cl.
*H01L 27/14* (2006.01)
*H01L 27/146* (2006.01)

(52) U.S. Cl.
CPC .... *H01L 27/14621* (2013.01); *H01L 27/1462* (2013.01); *H01L 27/14603* (2013.01);

(Continued)

(58) Field of Classification Search
CPC ......... H01L 27/14621; H01L 27/14625; H01L 27/14627; H01L 27/14632;
(Continued)

(56) References Cited

U.S. PATENT DOCUMENTS

2002/0055226 A1  5/2002  Liu et al.
2005/0101049 A1  5/2005  Kim
(Continued)

FOREIGN PATENT DOCUMENTS

| KR | 1020050045676 | 5/2005 |
|----|---|---|
| KR | 1020050051853 | 6/2005 |
| KR | 1020090059965 | 6/2009 |

OTHER PUBLICATIONS

Watanabe, Hisashi et al., "A 1.4μm front-side illuminated image sensor with novel light guiding structure consisting of stacked lightpipes," IEEE International Electron Devices Meeting (IEDM), Washington, D.C., Dec. 5-7, 2011, pp. 8.3.1-8.3.4.

*Primary Examiner* — Duy T Nguyen
(74) *Attorney, Agent, or Firm* — Slater Matsil, LLP

(57) ABSTRACT

A CMOS image sensor and a method of forming are provided. The CMOS image sensor may include a device wafer. A conductive feature may be formed on a back-side surface of the device wafer. The device wafer may include a pixel formed therein. A passivation layer may be formed over the back-side surface of the device wafer and the conductive feature. A grid film may be formed over the passivation layer. The grid film may be patterned to accommodate a color filter. The grid film pattern may align the color filter to corresponding pixel in the device wafer. A portion of the grid film formed over the conductive feature may be reduced to be substantially planar with portions of the grid film adjacent to the conductive feature. The patterning and reducing may be performed according to etching (Continued)

processes, chemical mechanical processes, and combinations thereof.

21 Claims, 5 Drawing Sheets

Related U.S. Application Data

(60) Provisional application No. 61/653,846, filed on May 31, 2012.

(52) U.S. Cl.
CPC .. *H01L 27/14636* (2013.01); *H01L 27/14643* (2013.01); *H01L 27/14685* (2013.01); *H01L 27/14689* (2013.01)

(58) Field of Classification Search
CPC ......... H01L 27/14645; H01L 27/14685; H01L 27/14687; H01L 27/14603; H01L 27/1462; H01L 27/14636; H01L 27/14643; H01L 27/14689

USPC ........................................................ 257/431
See application file for complete search history.

(56) References Cited

U.S. PATENT DOCUMENTS

| | | |
|---|---|---|
| 2006/0076689 A1 | 4/2006 | Rhodes |
| 2006/0146376 A1 | 7/2006 | Kim |
| 2006/0189062 A1 | 8/2006 | Deng et al. |
| 2008/0061330 A1 | 3/2008 | Shiau et al. |
| 2008/0116537 A1* | 5/2008 | Adkisson .......... H01L 27/14618 257/448 |
| 2008/0191249 A1 | 8/2008 | Hsieh et al. |
| 2009/0146236 A1 | 6/2009 | Lee et al. |
| 2009/0189233 A1* | 7/2009 | Liu .................. H01L 27/14625 257/432 |
| 2009/0200622 A1* | 8/2009 | Tai .................... H01L 27/14621 257/432 |
| 2010/0109113 A1* | 5/2010 | Jang ................. H01L 21/76898 257/432 |
| 2011/0298074 A1 | 12/2011 | Funao |
| 2012/0086091 A1 | 4/2012 | Crocherie |

\* cited by examiner

IMAGE SENSOR WITH LOW STEP HEIGHT BETWEEN BACK-SIDE METAL AND PIXEL ARRAY

CROSS REFERENCE TO RELATED APPLICATIONS

This application is a divisional of U.S. patent application Ser. No. 13/650,339, now U.S. Pat. No. 9,299,740, filed on Oct. 12, 2012, and entitled "Image Sensor with Low Step Height between Back-side Metal and Pixel Array" which claims the benefit of U.S. Provisional Application Ser. No. 61/653,846, filed on May 31, 2012, entitled, "Image Sensor with Low Step Height Between Backside Metal and Pixel Array," which is hereby incorporated herein by reference.

BACKGROUND

Back side illumination ("BSI") CMOS image sensors ("CISs") are becoming increasingly popular due to improved performance relative to conventional front side illumination ("FSI") CIS devices. Even though BSI devices eliminate the problems caused by multiple levels of metal interconnects in the light path between a lens and a photo-diode region of a CIS, BSI devices introduce their own types of performance degrading features. One such feature is color filter uniformity induced by topography at pixel array boundaries. This topography includes so-called steps between back-side metal features and the pixel regions.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

The making and using of the embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

In general terms, embodiments of the present disclosure may use a back-side grid film to compensate for step height differences between a back-side metal feature and adjacent pixel area(s). An advantageous result may be to minimize potential degradations in color filter uniformity by reducing the topography surrounding the pixel array.

Figure 1:
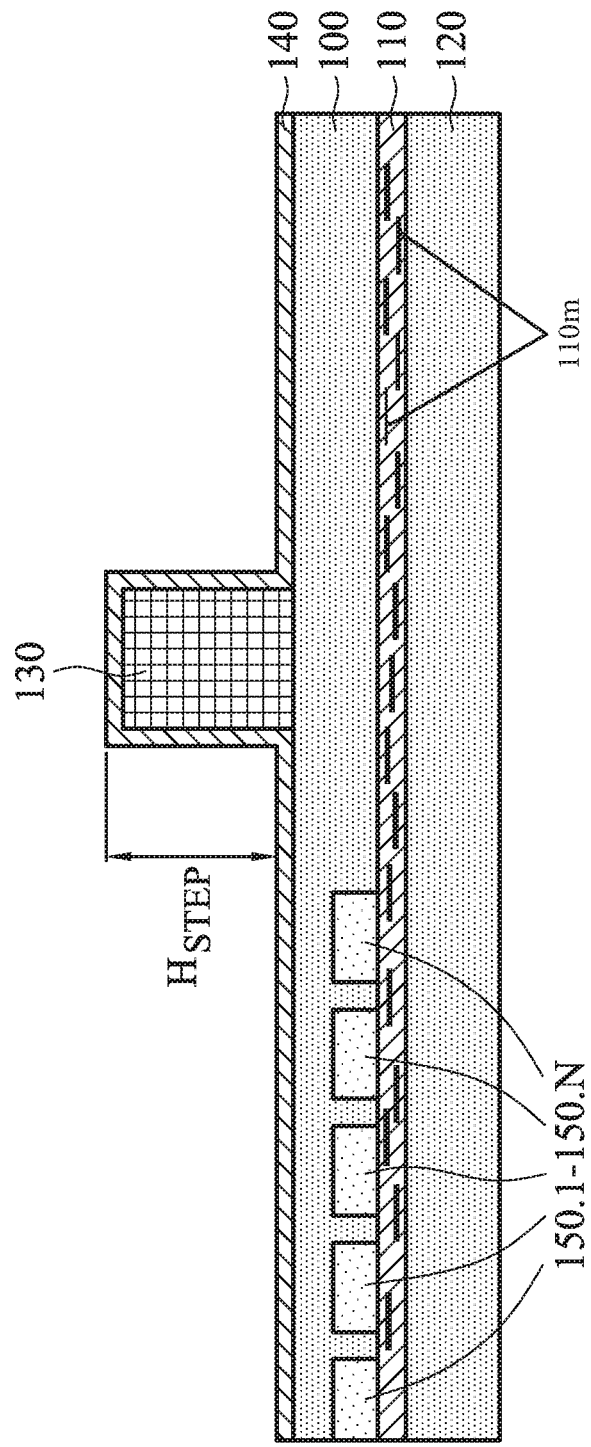
FIGS. 1-5 illustrate various intermediate stages of forming an embodiment.

With reference now to FIG. 1, there is shown a cross-section of a device wafer 100. The device wafer 100 may have a first and a second side, herein referred to respectively as a "back-side" and a "front-side." The device wafer 100 may have a plurality of pixels 150.1-150.N formed therein, one or more dielectric layers (represented as dielectric layer 110), a carrier wafer 120, one or more back-side metal features (represented as back-side metal feature 130), and a passivation layer 140.

The device wafer 100 may be a substrate such as, for example, silicon, germanium, diamond, or the like. In various embodiments, the device wafer 100 may be doped with a p-type or an n-type dopant, such as boron, aluminum, gallium, or the like, as is known in the art. In various embodiments, the device wafer 100 may undergo an etching or thinning process to thin the device wafer 100 at the back-side such that light directed through the back surface thereof may effectively reach the one or more pixels 150.1-150.N formed within the substrate. The carrier wafer 120 may comprise, for example, a type of wafer commonly referred to as a handle wafer.

Each of the pixels 150.1-150.N may include, for example, transistors (e.g., switching transistors, reset transistors, etc.), capacitors, and a photo-sensitive element (e.g., a photo-diode). The photo-diode may convert photons into electrons, such that a photo-diode within a pixel is exposed to light, an electrical charge is induced in the photo-diode. Each pixel 150.1-150.N may generate electrons proportional to the amount of light that falls on the corresponding pixel when light is incident on the pixel from a subject scene. The electrons may then be converted into a voltage signal in the pixel and further transformed into a digital signal by means of an A/D converter (not shown). A plurality of periphery circuits (also not shown) may receive the digital signals and process them to display an image of a subject scene.

The dielectric layer 110 may be formed over the device wafer 100 and may include one or more metallization layers 110m to electrically couple electronic devices to form circuits. A passivation layer may overlay the dielectric layer 110 to protect the components from the environment.

The carrier wafer 120 may provide additional support to the device wafer 100. The carrier wafer 120 may be formed of various materials, including but not limited to, glass, silicon, ceramics, combinations thereof or the like. In an embodiment, the device wafer 100 may be attached to the carrier wafer 120 using, for example, UV glue.

The back-side metal feature 130 may be formed on the device wafer 100 back-side surface. The back-side metal feature 130 may be formed of copper, aluminum, gold, tungsten, combinations thereof or the like using a process such as, for example, one or more subtractive etch processes, electrochemical deposition, electrochemical plating, or the like. In an embodiment, the back-side metal feature 130 may provide an interconnection point for forming electrical connections with the device wafer 100. In another embodiment, the back-side metal feature 130 may be used as a spacing device.

The passivation layer 140 may be formed over the device wafer 100 and the back-side metal feature 130. The passivation layer 140 may be formed of, for example, a polyimide layer, polybenzoxazole ("PBO"), benzocyclobutene ("BCB"), a non-photosensitive polymer, and in alternative embodiments, may be formed of nitride, carbide, silicon oxide, silicon nitride, low-k dielectrics such as carbon doped oxides, extremely low-k dielectrics such as porous carbon doped silicon dioxide combinations thereof, and/or other like material. The device wafer 100 thinning process, discussed above, may be performed prior to formation of the passivation layer 140 over the back-side surface of the device wafer 100 and the back-side metal feature 130.

As shown in FIG. 1 a step having a height represented by $H_{STEP}$ may be created by the back-side metal feature 130 and the passivation layer 140 formed thereon. As discussed below with reference to FIG. 5, a color filter array ("CFA") may be formed over the passivation layer 140. In order to obtain improved color filter uniformity for the CFA, it is desirable to reduce a step height between an upper surface of the passivation layer 140 positioned over the back-side metal feature 130 and areas adjacent thereto to a height $H_{MINSTEP}$. Reducing the step height to $H_{MINSTEP}$ may improve color filter uniformity for the CFA as well as the improve signal-to-noise performance and quantum effect ("QE") performance for the pixels 150.1-150.N.

Figure 2:
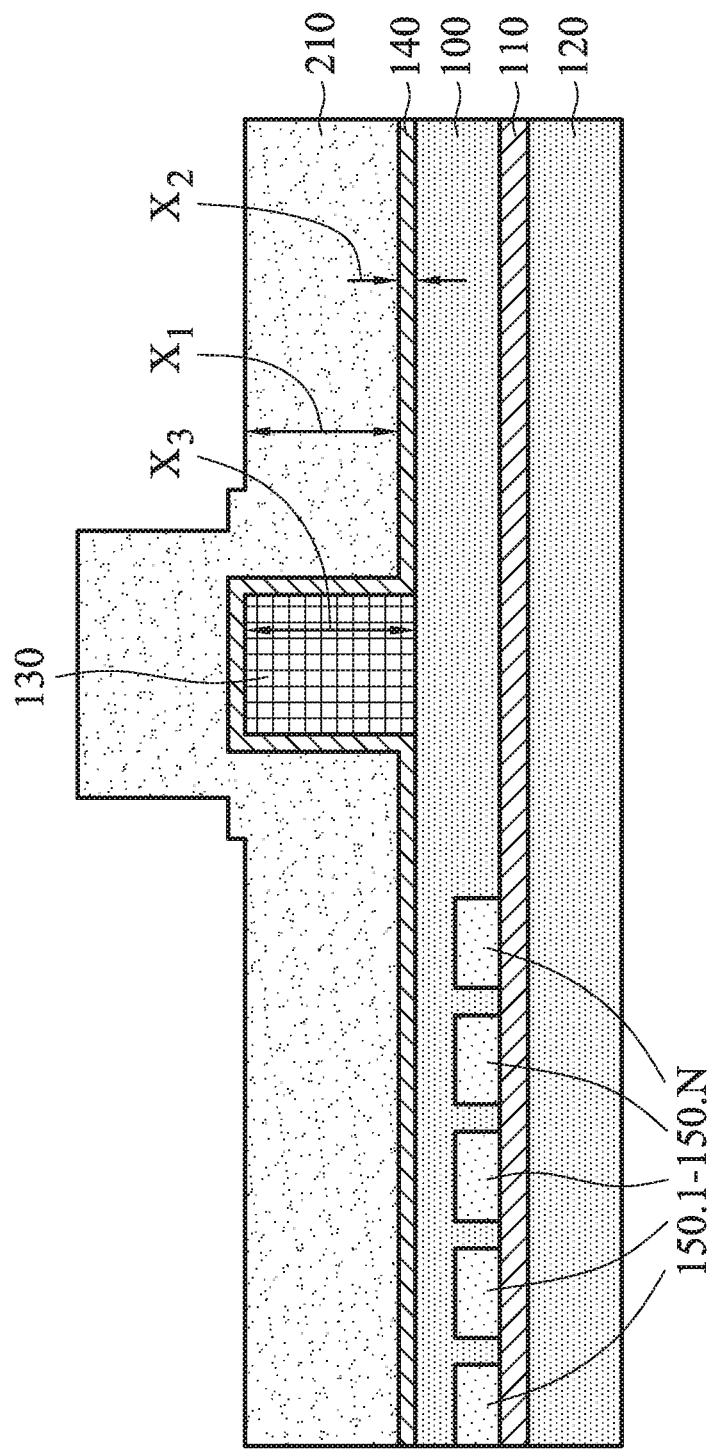

FIG. 2 illustrates the device of FIG. 1 with the addition of a grid film 210. The grid film 210 may be formed to a thickness sufficient to cover the back-side metal feature 130. As illustrated, the grid film 210 may be deposited or otherwise conformably formed, so that it may cover the back surface of the device wafer 100, the back-side metal feature 130, and the passivation layer 140.

In some embodiments, the grid film 210 may be formed of a dielectric layer such as, for example, silicon oxide, silicon nitride, polyimide and the like. In other embodiments, and using appropriate insulating layers (not shown), the grid film 210 could be or could include a metal film such as aluminum, copper, tungsten, combinations thereof and/or the like. In some embodiments, the grid film 210 may be a multiple layer film having both a dielectric layer and a metal layer. A dielectric material may be deposited using, for example, plasma enhanced chemical vapor deposition ("PECVD"), thermal chemical vapor deposition ("CVD"), atmospheric pressure CVD ("APCVD"), physical vapor deposition ("PVD"), and the like. A metal material may be deposited using, for example, PVD, sputtering, a plasma process, and the like.

In an illustrative example, with reference to FIG. 2, the grid film 210 may be formed to a thickness of from about 1000 Å to about 8000 Å (shown here as "X1") as formed over the back-side metal feature 130 and the passivation layer 140. The passivation layer 140 may be formed to a thickness of from about 100 Å to about 4000 Å (shown here as "X2"), and the back-side metal feature 130 may be formed to a thickness of from about 1000 Å to about 8000 Å (shown here as "X3").

After the grid film 210 may be formed over the passivation layer 140, the grid film 210 may be processed to accommodate positioning the CFA in the grid film 210. Portions of the grid film 210 formed over the passivation layer 140 on the back-side metal feature 130 may also be removed to reduce the step height (e.g., $H_{MINSTEP}$ discussed in greater detail in FIG. 5 below) between the a top surface of the back-side metal feature 130/passivation layer 140 and adjacent areas of the device wafer 100 having the grid film 210 formed thereon. In an embodiment, the reduced step height may preferably be kept to about 2000 Å or less as represented by the following equation:

$$(X1+X3)-(X1+X2) \leq 2000 \text{ Å} \qquad \text{Eqn. 1}$$

Various techniques may be used to process the grid film 210 to accommodate positioning the CFA therein and to reduce the step height between the top surface of the back-side metal feature 130/passivation layer 140 and adjacent areas of the device wafer 100 having the grid film 210 formed thereon.

Figure 3:
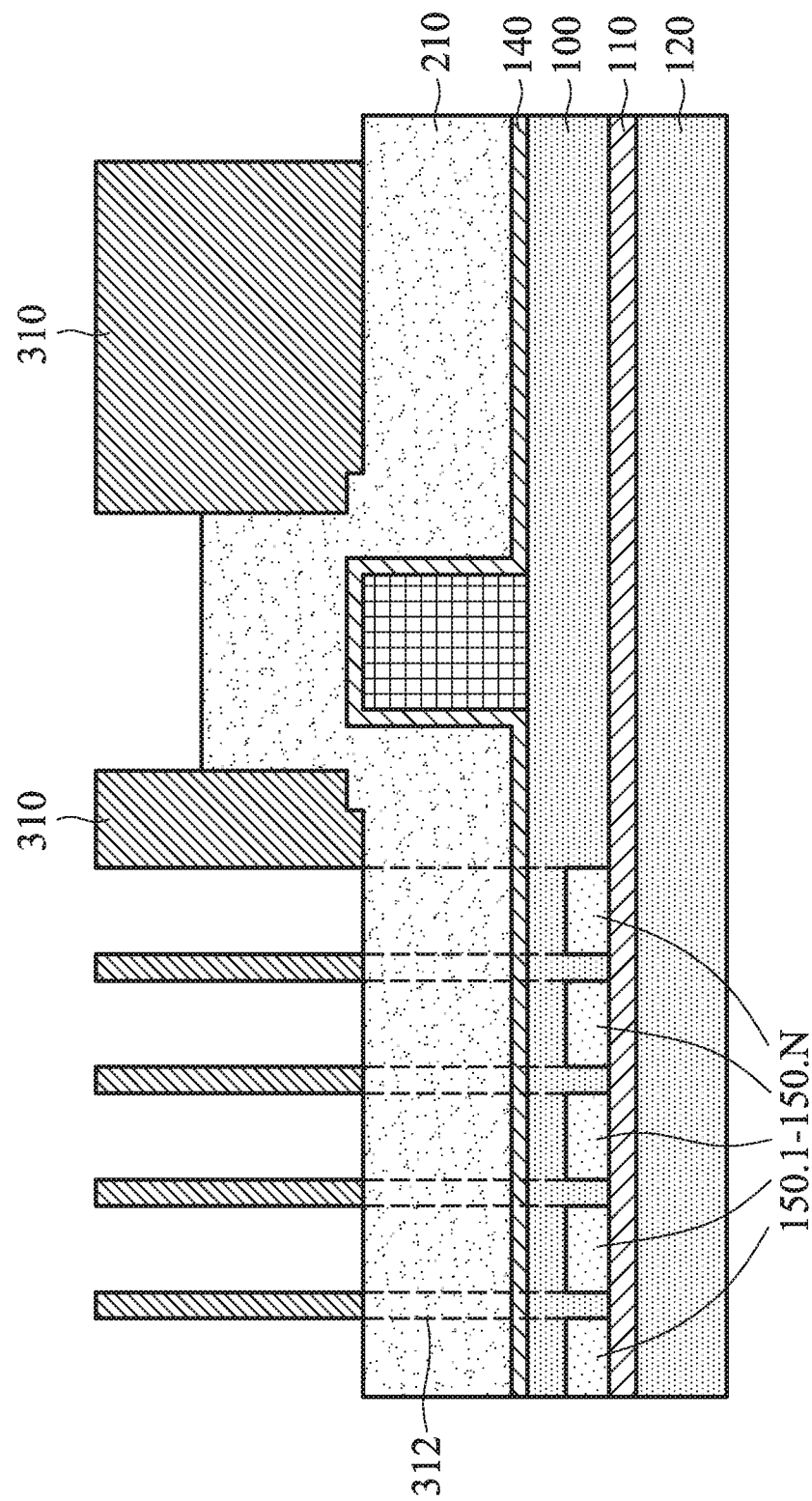

For example, FIG. 3 illustrates the device of FIG. 2 with the formation and patterning of a photoresist film 310 on the grid film 210 to pattern the grid film 210 at predetermined alignment offsets for forming the CFA therein as well as to reduce the grid film 210 positioned over the back-side metal feature 130. The alignment offsets may align the CFA with the one or more pixels 150.1-150.N formed within the device wafer 100. In an illustrative example, the pattern offsets for the photoresist film 310 are shown by dashed lines 312, which indicate alignment offsets with the pixels 150.1-150.N. As illustrated in FIG. 3, the photoresist film 310 may also be patterned to remove the portions of the grid film 210 formed over the passivation layer 140 on the back-side metal feature 130.

Figure 4:
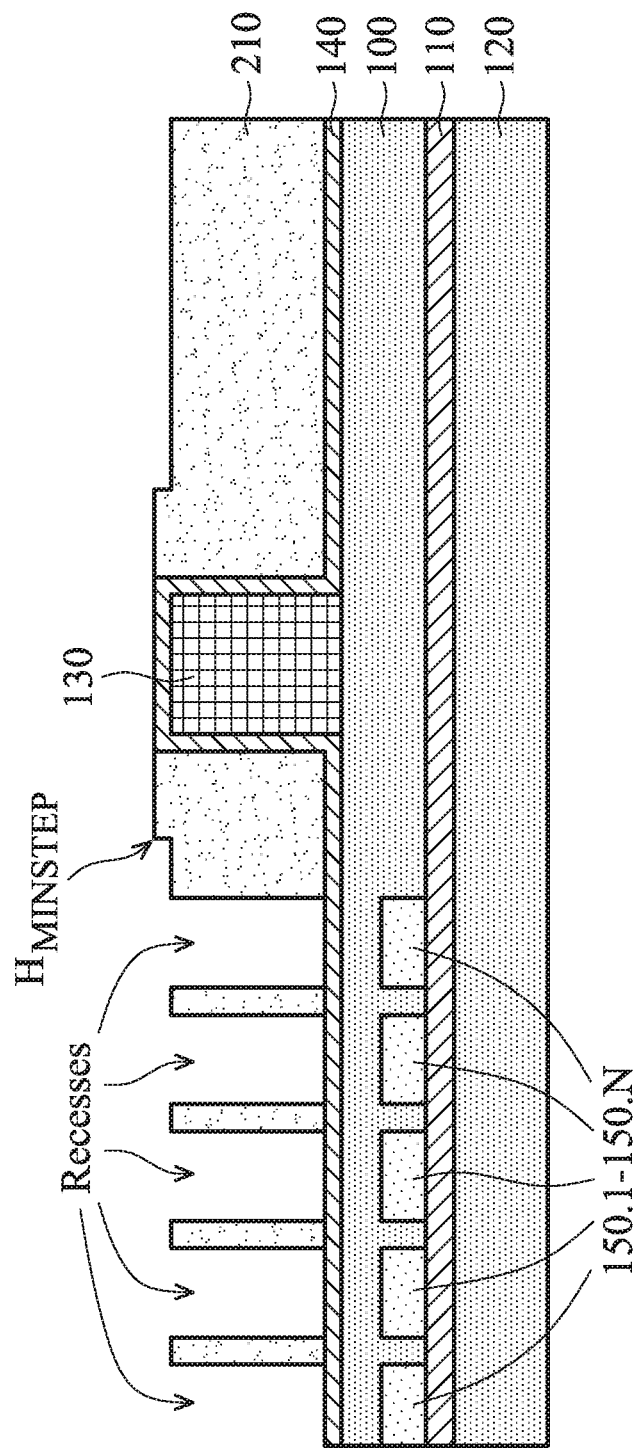

Following patterning, the grid film 210 may be etched away using an appropriate process, as illustrated in FIG. 4. The etching may form recesses in the grid film 210 for positioning the color filter array therein. The etching may also remove the grid film 210 formed over the back-side metal feature 130. In various embodiments, the etching process may include dry etching, wet etching, or a combination thereof.

In an embodiment, the grid film 210 may be removed from the area over the back-side metal feature 130/passivation layer 140 using a chemical mechanical polish ("CMP") process. In such an embodiment, the grid film 210 may be formed over the back surface of the device wafer 100, passivation layer 140, and the back-side metal feature 130, as discussed above. The CMP process may then be used to thin the grid film 210 to a height relatively planar to a top surface of the passivation layer 140 over the back-side metal feature 130. Thinning the grid film 210 to this height may reduce the step height between the back-side metal feature 130 and adjacent back-side areas of the device wafer 100 having the grid film 210 formed thereon. Following the thinning, the grid film 210 may then be patterned and etched using etching processes as discusses above to accommodate positioning the CFA in the grid film 210 over the pixels 150.1-150.N.

Removing or thinning the grid film 210 over the back-side metal feature 130 may reduce the step height between the back-side metal feature 130 and areas of the grid film 210 adjacent thereto to a height $H_{MINSTEP}$, as illustrated in FIG. 4. Note that the reduced step height $H_{MINSTEP}$ shown in FIG. 4 is exaggerated for illustrative purposes only. Ideally, the reduced step height $H_{MINSTEP}$ is non-existent, or at least is substantially reduced (i.e., less than 2000 Å) relative to conventional techniques and devices. In an embodiment, the passivation layer 140 formed over the back-side metal feature 130 may be further removed or thinned to be relatively planar to the grid film 210 adjacent to the back-side metal feature 130.

Figure 5:
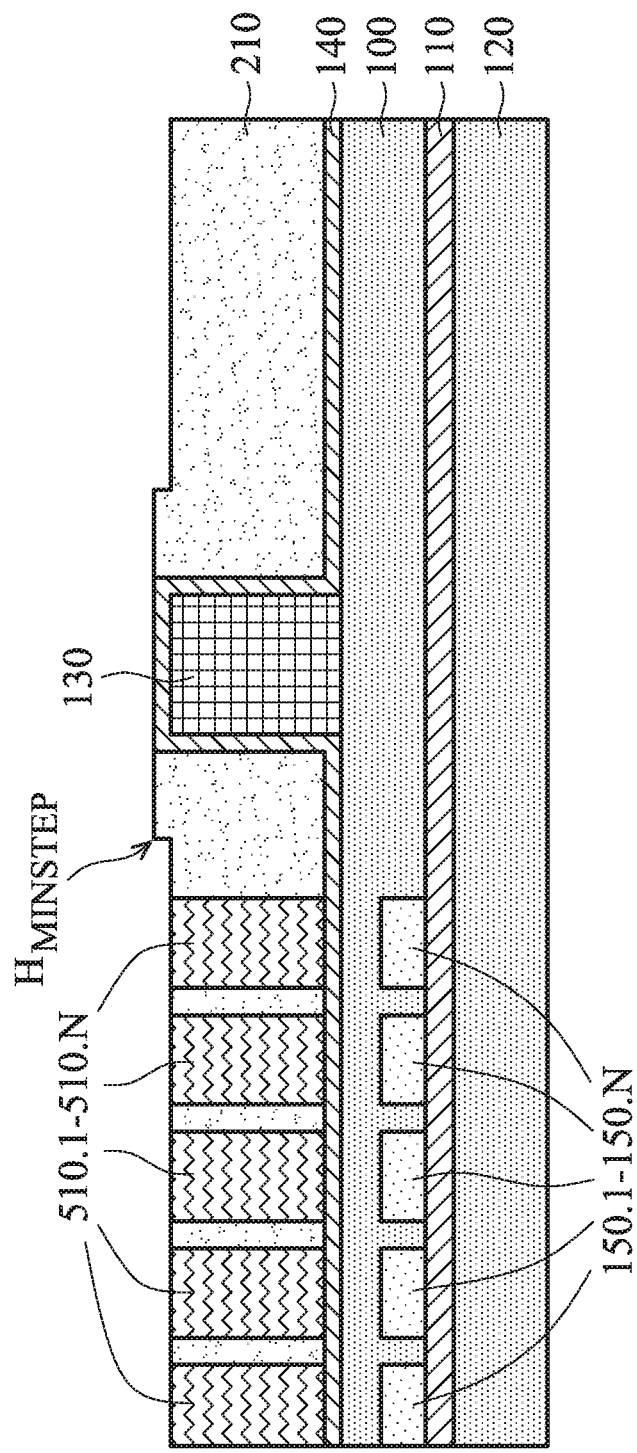

FIG. 5 illustrates an array of color filters 510.1-510.N (i.e., the CFA referred to herein) that may be positioned in the recesses formed within the grid film 210 of FIG. 4. As illustrated in FIG. 5, the color filters 510.1-510.N may be self-aligned in the grid film 210 by virtue of the recesses formed therein, thus, alignment for the color filters 510.1-510.N may be improved.

Each of a color filter 510.1-510.N may be used to allow predetermined wavelengths of light to pass through the filter while reflecting other wavelengths, thereby allowing an image sensor (not shown) to determine the color of the light being received by each of the corresponding pixels. The color filters 510.1-510.N may vary, such as a combination including a red, green, and blue filter. Other combinations, such as cyan, yellow, and magenta, may also be used. The number of different colors and/or color combinations for the color filters 510.1-510.N may also vary. The color filters 510.1-510.N may comprise, for example, a pigmented or dyed material, such as an acrylic. For example, polymethylmethacrylate ("PMMA") or polyglycidylmethacrylate ("PGMS") are suitable materials with which a pigment or dye may be added to form the color filters 510.1-510.N. Other materials, however, may be used. The color filters 510.1-510.N may be formed by any suitable method.

FIG. 5 also illustrates the reduced step height $H_{MINSTEP}$ between an upper surface of the back-side metal feature 130/passivation layer 140 and portions of the grid film 210 adjacent to the back-side metal feature 130. Again, note that the reduced step height $H_{MINSTEP}$ as illustrated in FIG. 5 is exaggerated for illustrative purposes only. Ideally, the reduced step height $H_{MINSTEP}$ is non-existent, or at least is substantially reduced (i.e., less than 2000 Å). As discussed above, the reduced step height and improved alignment may improve color filter uniformity for the color filters 510.1-510.N as well as the improve signal-to-noise performance and quantum effect ("QE") performance for the pixels 150.1-150.N.

In an embodiment, a method is provided. The method comprises providing a substrate having a photo-diode formed therein and a conductive feature on a back-side of the substrate; forming a passivation layer over the back-side of the substrate and the conductive feature; forming a grid film over the passivation layer, reducing the grid film over the conductive feature; and patterning the grid film to form a grid pattern.

In another embodiment, another method is provided. The method comprises providing a semiconductor wafer having a conductive feature formed on a back-side of the semiconductor wafer and a plurality of pixel devices formed within the semiconductor wafer; forming a grid film over the back-side of a CMOS image sensor and the conductive feature; reducing the grid film over the conductive feature; and patterning the grid film to form a grid pattern.

In an embodiment, a device is provided. The device comprises a substrate, a photo-diode formed in the substrate, a conductor formed on a back surface of the substrate, a passivation layer formed on the back surface of the substrate; and a patterned grid film formed on the passivation layer, the patterned grid film having a top surface that is substantially planar with a top surface of the conductor.

It should be understood that the above description provides a general description of embodiments and that embodiments may include numerous other features. For example, embodiments may include formation of contacts, passivation layers, molding compounds, interconnect structures (e.g., lines and vias, metal layers, and interlayer dielectric that provide electrical interconnection to the device). Additionally, the structure, placement, and positioning of the pixels and color filters, are provided for illustrative purposes only, and accordingly, other embodiments may utilize different structures, placements, and positions.

Although the present embodiments and their advantages have been described in detail, it should be understood that various changes, substitutions and alterations can be made herein without departing from the spirit and scope of the disclosure as defined by the appended claims. For example, it will be readily understood by those skilled in the art that the structures and ordering of steps as described above may be varied while remaining within the scope of the present disclosure.

Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device, comprising:
a substrate;
a photo-diode formed in the substrate;
a conductor formed on a first surface of the substrate;
a passivation layer formed on the first surface of the substrate; and
a patterned grid film formed on the passivation layer, the passivation layer being interposed between the first surface of the substrate and the patterned grid film, the patterned grid film having a first surface that is substantially planar with a first surface of the conductor, the first surface of the patterned grid film being most distal the substrate.

2. The device of claim 1, wherein the patterned grid film is planar to less than about 2000 Å with the first surface of the conductor.

3. The device of claim 1, wherein the patterned grid film is made of a material selected from the group consisting of a dielectric, a metal, an insulator, and combinations thereof.

4. The device of claim 1, further comprising a color filter on the first surface of the substrate and in the patterned grid film, the color filter aligned with the photo-diode.

5. The device of claim 1, wherein the patterned grid film has a thickness between about 1000 Å and about 8000 Å.

6. The device of claim 1, further comprising a plurality of color filters on the first surface of the substrate, each of the plurality of color filters comprising a red, a green, or a blue filter.

7. The device of claim 6, wherein the plurality of color filters comprise polymethyl-methacrylate (PMMA) or polyglycidylmethacrylate (PGMS).

8. The device of claim 1, further comprising a dielectric layer formed on a second side of the substrate, the dielectric layer comprising a plurality of metallization layers.

9. A device comprising:
a dielectric layer disposed over a first side of a substrate;
a plurality of pixel devices disposed in the substrate, the plurality of pixel devices contacting the dielectric layer;
a plurality of conductive features disposed over a second side of the substrate, the second side opposite the first side;
a passivation layer disposed over the plurality of conductive features, a region of the passivation layer directly over the plurality of conductive features; and
a grid film disposed over the passivation layer, the region of the passivation layer being free of the grid film, the grid film having a top surface most distal from the substrate, the top surface being substantially planar with a first surface of the plurality of conductive features, the grid film having a lower surface opposite the top surface, the lower surface physically contacting the passivation layer.

10. The device of claim 9, wherein the top surface of the grid film and the top surface of the plurality of conductive features are planar to within 2000 Å.

11. The device of claim 9, wherein the grid film is a material selected from the group consisting essentially of silicon oxide, silicon nitride, silicon oxynitride, copper, aluminum, tungsten, a copper aluminum alloy, and combinations thereof.

12. The device of claim 9, wherein the grid film is made of a material selected from the group consisting of a dielectric, a metal, and a combination.

13. The device of claim 9, wherein the dielectric layer comprises a metallization layer.

14. The device of claim 9, further comprising a color filter array in the grid film, wherein each color filter of the color filter array is aligned to a corresponding pixel device of the plurality of pixel devices.

15. The device of claim 14, wherein the color filter array comprises polymethyl-methacrylate (PMMA) or polyglycidylmethacrylate (PGMS).

16. The device of claim 9, wherein the plurality of pixel devices are co-planar with a bottom surface of the substrate, the bottom surface being most distal from the conductive features.

17. A device comprising:
   a substrate;
   a plurality of pixel devices embedded in the substrate at a front-side surface of the substrate;
   a metal feature disposed over a back-side surface of the substrate, the back-side surface opposite the front-side surface, the metal feature being more proximal to the back-side surface than to the front-side surface;
   a passivation layer disposed over the metal feature, the passivation layer physically contacting the metal feature; and
   a patterned grid film disposed over the passivation layer, a region of the passivation layer directly over the metal feature being free of the patterned grid film.

18. The device of claim 17, wherein a top surface of the patterned grid film and a top surface of the metal feature are planar to within 2000 Å.

19. The device of claim 17, wherein the patterned grid film is a material selected from the group consisting essentially of silicon oxide, silicon nitride, silicon oxynitride, copper, aluminum, tungsten, a copper aluminum alloy, and combinations thereof.

20. The device of claim 17, wherein the patterned grid film is made of a material selected from the group consisting of a dielectric, a metal, and a combination.

21. The device of claim 17, wherein the passivation layer physically contacts a back-side surface and side surfaces of the metal feature.

* * * * *

UNITED STATES PATENT AND TRADEMARK OFFICE
CERTIFICATE OF CORRECTION

PATENT NO.         : 10,074,680 B2
APPLICATION NO.    : 15/061799
DATED              : September 11, 2018
INVENTOR(S)        : Chien-Hsien Tseng Page 1 of 1

It is certified that error appears in the above-identified patent and that said Letters Patent is hereby corrected as shown below:

On the Title Page

Item (72) Inventors, Lines 1-2, delete "TX (US)" and insert --(TW)--.

Signed and Sealed this
Eleventh Day of December, 2018

Andrei Iancu
*Director of the United States Patent and Trademark Office*